(12) United States Patent
Lin

(10) Patent No.: US 10,777,723 B2
(45) Date of Patent: Sep. 15, 2020

(54) LED PACKAGE STRUCTURE, HEAT-DISSIPATING SUBSTRATE, METHOD FOR MANUFACTURING LED PACKAGE STRUCTURE, AND METHOD FOR MANUFACTURING HEAT-DISSIPATING SUBSTRATE

(71) Applicant: LITE-ON TECHNOLOGY CORPORATION, Taipei (TW)

(72) Inventor: Chen-Hsiu Lin, New Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/747,306

(22) Filed: Jan. 20, 2020

(65) Prior Publication Data
US 2020/0152847 A1    May 14, 2020

Related U.S. Application Data

(62) Division of application No. 16/127,357, filed on Sep. 11, 2018, now Pat. No. 10,573,797.

(30) Foreign Application Priority Data

Dec. 15, 2017 (CN) .......................... 2017 1 1348197

(51) Int. Cl.
*H01L 33/64* (2010.01)
*H01L 25/075* (2006.01)
(Continued)

(52) U.S. Cl.
CPC ............ *H01L 33/647* (2013.01); *H01L 23/62* (2013.01); *H01L 25/0753* (2013.01); *H01L 25/167* (2013.01); *H01L 33/483* (2013.01); *H01L 33/58* (2013.01); *H01L 33/60* (2013.01); *H01L 33/62* (2013.01); *H01L 33/642* (2013.01); *H01L 2933/0075* (2013.01)

(58) Field of Classification Search
CPC . H01L 33/647; H01L 33/642; H01L 25/0753; H01L 25/167; H01L 33/58
See application file for complete search history.

(56) References Cited

U.S. PATENT DOCUMENTS

| 9,705,052 | B1* | 7/2017 | Lin | H01L 33/505 |
| 2012/0267654 | A1* | 10/2012 | Lee | H05K 1/0209 |
| | | | | 257/91 |
| 2013/0250183 | A1* | 9/2013 | Ishimoto | H04N 5/64 |
| | | | | 348/739 |

* cited by examiner

*Primary Examiner* — Anthony Ho
(74) *Attorney, Agent, or Firm* — Li & Cai Intellectual Property (USA) Office

(57) ABSTRACT

The present disclosure discloses a light emitting diode (LED) package structure, a heat-dissipating substrate, a method for manufacturing an LED package structure, and a method for manufacturing a heat-dissipating substrate. The method for manufacturing the heat-dissipating substrate includes: providing a metal plate having a top surface and a bottom surface; implementing an etching process on the metal plate so as to form a first heat-dissipating block, a second heat-dissipating block, and a heat-dissipating plate spaced apart from each other; and filling an insulating material between the heat-dissipating plate and the first heat-dissipating block and between the heat-dissipating plate and the second heat-dissipating block so as to electrically isolate the heat-dissipating plate, the first heat-dissipating block, and the second heat-dissipating block from each other.

20 Claims, 19 Drawing Sheets

(51) Int. Cl.
*H01L 25/16* (2006.01)
*H01L 23/62* (2006.01)
*H01L 33/58* (2010.01)
*H01L 33/60* (2010.01)
*H01L 33/62* (2010.01)
*H01L 33/48* (2010.01)

LED PACKAGE STRUCTURE, HEAT-DISSIPATING SUBSTRATE, METHOD FOR MANUFACTURING LED PACKAGE STRUCTURE, AND METHOD FOR MANUFACTURING HEAT-DISSIPATING SUBSTRATE

CROSS-REFERENCE TO RELATED PATENT APPLICATION

The present application is a divisional application of co-pending application Ser. No. 16/127,357, filed on Sep. 11, 2018 and entitled "LED PACKAGE STRUCTURE, HEAT-DISSIPATING SUBSTRATE, AND METHOD FOR MANUFACTURING HEAT-DISSIPATING SUBSTRATE", now allowed. Moreover, this divisional application rejoins claims based on Invention II, according to the Restriction Requirement dated Jul. 30, 2019, augmented with new claims supported by original specification.

BACKGROUND OF THE INVENTION

1. Field of the Invention

The present disclosure relates to a package structure; in particular, to a light emitting diode (LED) package structure, a heat-dissipating substrate, a method for manufacturing an LED package structure, and a method for manufacturing a heat-dissipating substrate.

2. Description of Related Art

A conventional circuit board is formed with at least one through hole, and at least one conductive pillar is formed in the at least one through hole of the conventional circuit board, thereby providing the conventional circuit board with electrically conductive and heat-dissipating functions. However, the conductive pillar of the conventional circuit board has a small heat-dissipating area and poor heat resistance, and the conventional circuit board has a high cost as it is formed by an aluminum nitride substrate, so that the conventional circuit board cannot satisfy gradually increasing heat-dissipating demands on the market.

SUMMARY OF THE INVENTION

The present disclosure provides a light emitting diode (LED) package structure having a high heat conductive performance and a thin structure, a heat-dissipating substrate, and a method for manufacturing a heat-dissipating substrate to effectively improve the drawbacks associated with conventional circuit boards.

The present disclosure provides a heat-dissipating substrate being in the shape of a panel. The heat-dissipating substrate includes a first heat-dissipating block, a heat-dissipating plate and a second heat-dissipating block spaced apart each other, and a lateral insulating member connected to thereof so as to electrically isolate the first heat-dissipating block, the second heat-dissipating block, and the heat-dissipating plate from each other. The first heat-dissipating block, the second heat-dissipating block and the heat-dissipating plate each has two protrusions respectively formed on two opposite surfaces thereof. A height of each of the protrusions is at a micro level.

In summary, for the LED package structure, the heat-dissipating substrate, and the method of the present disclosure, the lateral insulating member (i.e., the first insulator and the second insulator) is provided to electrically isolate the first heat-dissipating block, the second heat-dissipating block, and the heat-dissipating plate from each other, so that the heat-dissipating substrate can be formed with an electrically conductive property. The first heat-dissipating block, the second heat-dissipating block, and the heat-dissipating plate occupy a greater portion of the heat-dissipating substrate, so that the heat-dissipating substrate can be formed with a better thermally conductive property.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

Reference is made to FIGS. 1 to 19, which illustrate an embodiment of the present disclosure. References are hereunder made to the detailed descriptions and appended drawings in connection with the present disclosure. However, the appended drawings are merely provided for exemplary purposes, and should not be construed as restricting the scope of the present disclosure.

LED Package Structure

Figure 1:
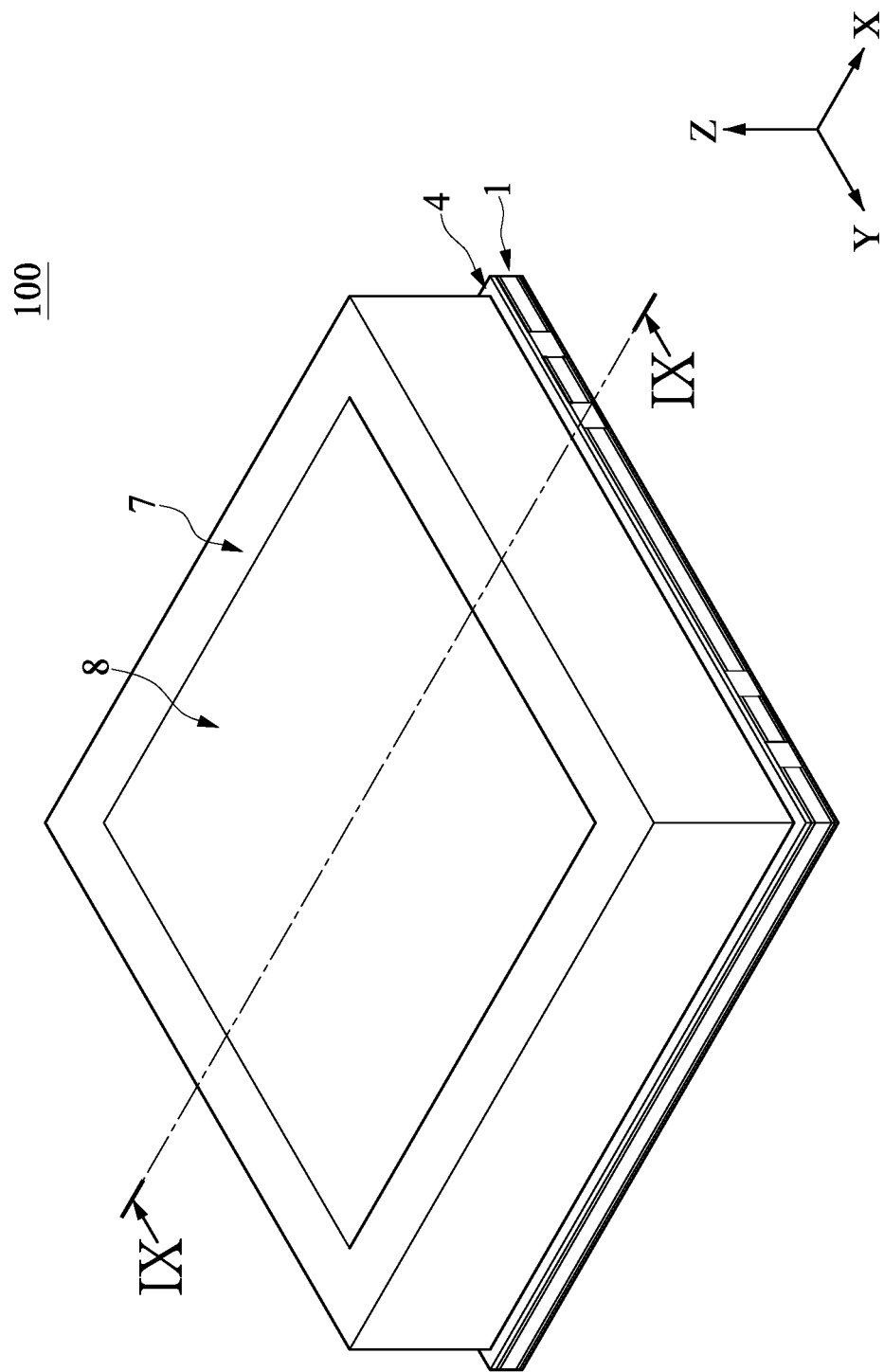
FIG. 1 is a perspective view showing a light emitting diode (LED) package structure according to an embodiment of the present disclosure.
Figure 2:
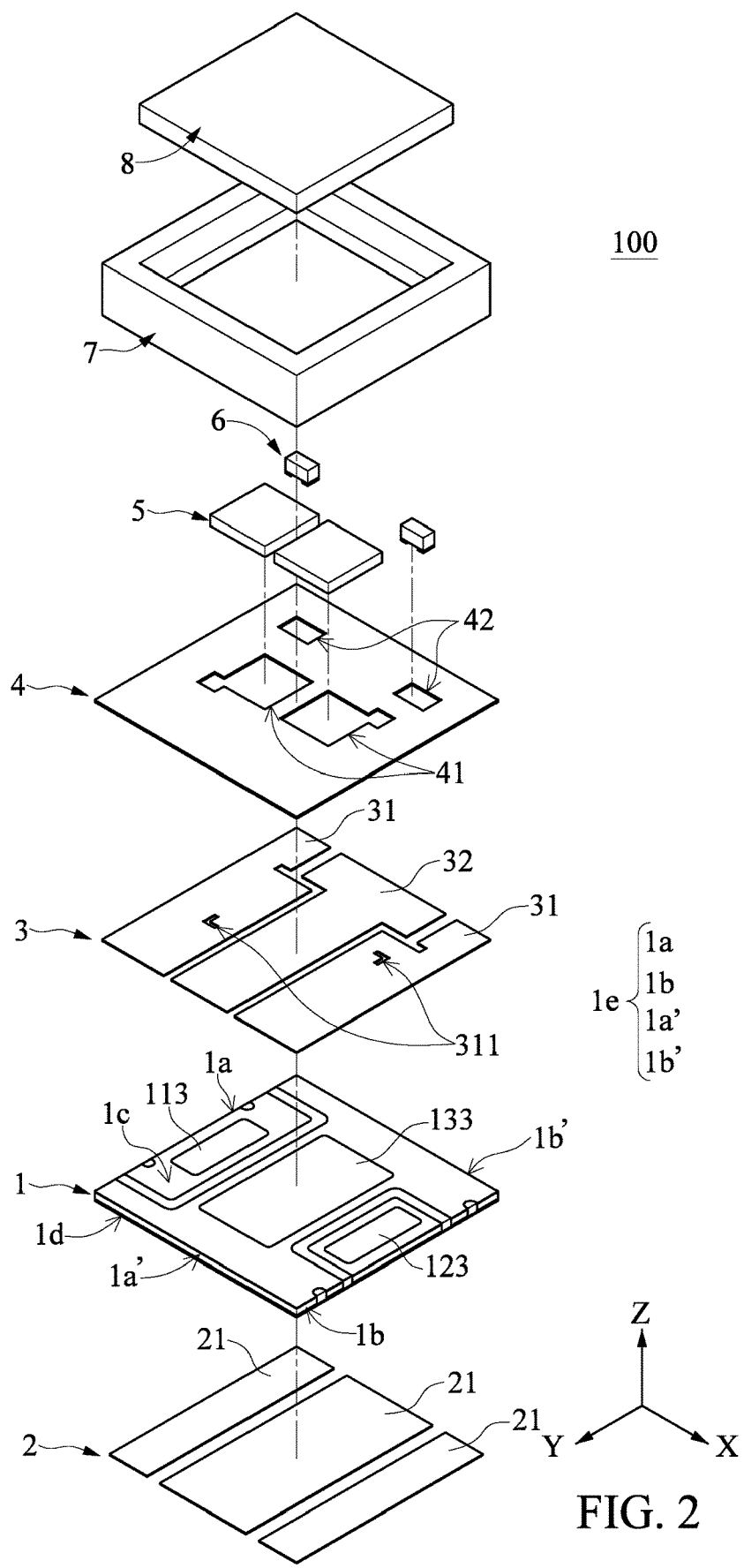
FIG. 2 is an exploded view of FIG. 1.
Figure 3:
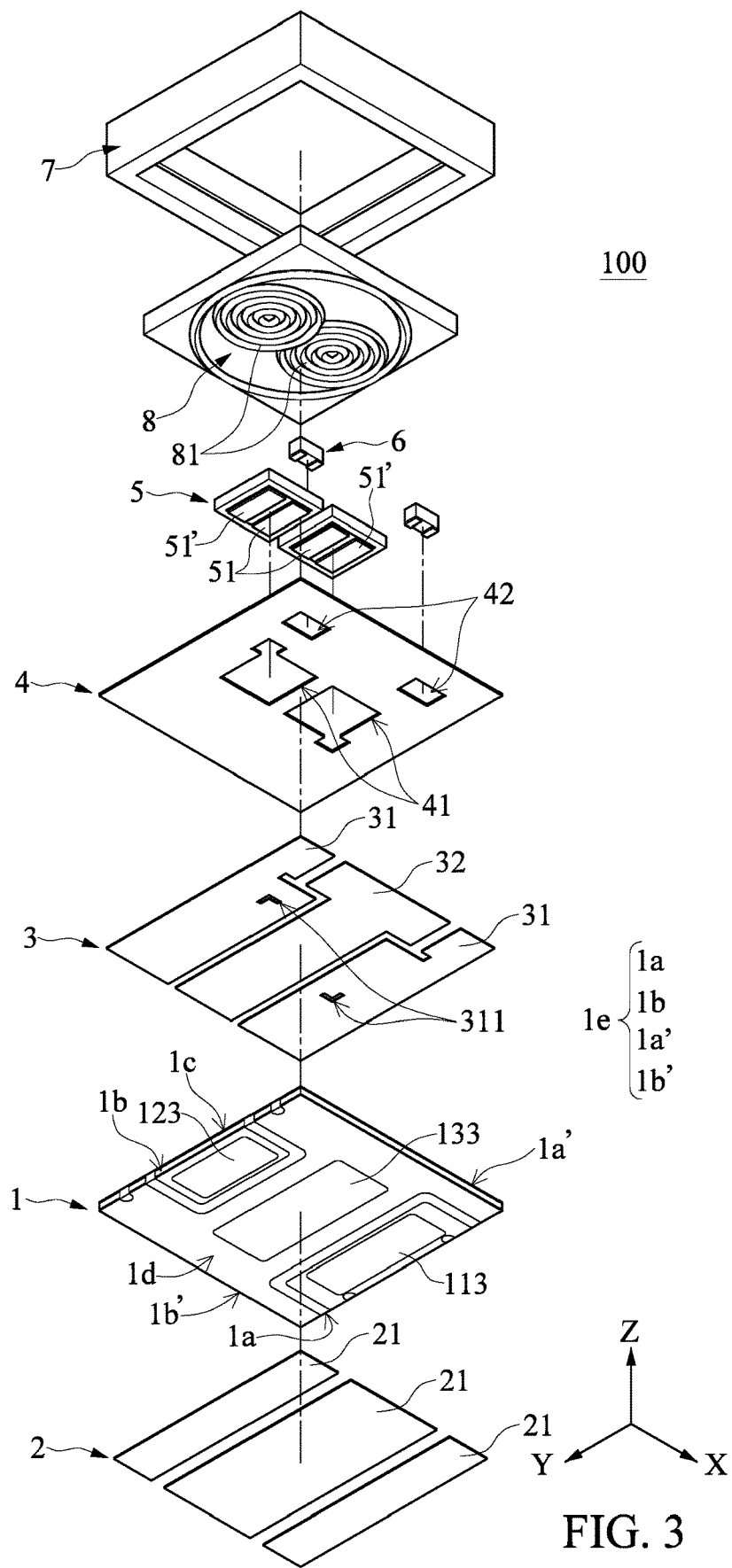
FIG. 3 is an exploded view of FIG. 1 from another perspective.

Referring to FIGS. 1 to 9, the present embodiment discloses a light emitting diode (LED) package structure 100. As shown in FIGS. 1 to 3, the LED package structure 100 of the present embodiment includes a heat-dissipating substrate 1, a soldering layer 2 and an electrode layer 3 both respectively disposed on two opposite surfaces of the heat-dissipating substrate 1, a reflective solder mask layer 4 disposed on the heat-dissipating substrate 1 and covering a part of the electrode layer 3, two light emitting units 5 and two transient voltage suppression (TVS) diodes 6 both disposed on the other part of the electrode layer 3 uncovered by the reflective solder mask layer 4, a reflective housing 7 disposed above the heat-dissipating substrate 1, and an optical member 8 adhered to the reflective housing 7. The following description discloses the structure of the heat-dissipating substrate 1 of the LED package structures 100, and then describes the other components of the LED package structures 100 and the connection relationship between the components of the LED package structure 100.

As shown in FIGS. 3 to 7, the heat-dissipating substrate 1 is in the shape of a panel and has a top plane 1c, a bottom plane 1d, and a side surface 1e connecting the top plane 1c and the bottom plane 1d. The side surface 1e includes a first edge 1a, a second edge 1b opposite to the first edge 1a, a third edge 1a', and a fourth edge 1b' opposite to the third edge 1a'. The heat-dissipating substrate 1 in the present embodiment can be a rectangular structure or a square structure, but the present disclosure is not limited thereto. The heat-dissipating substrate 1 includes a first heat dissipating block 11, a second heat-dissipating block 12 spaced apart from the first heat-dissipating block 11, a heat-dissipating plate 13 spaced apart from and arranged between the first heat-dissipating block 11 and the second heat-dissipating block 12, a lateral insulating member 14 disposed between the first and second heat-dissipating blocks 11, 12 and the heat dissipating plate 13, a longitudinal insulating member 15 formed on the top and bottom of the heat-dissipating plate 13. Moreover, the lateral insulating member 14 in the present embodiment can be used to connect the first heat-dissipating block 11 and the second heat-dissipating block 12 to the heating dissipating plate 13. The first heat-dissipating block 11 the second heat-dissipating block 12, the heating dissipating plate 13, and the lateral insulating member 14 are in a substantially coplanar arrangement.

It should be noted that an X direction, a Y direction, and a Z direction of the figures perpendicular to each other are provided to clearly illustrate the present embodiment. The Z direction is perpendicular to the top plane 1c (or the bottom plane 1d) of the heat-dissipating substrate 1, and the X direction is parallel to an arrangement direction of the first heat-dissipating block 11 and the second heat-dissipating block 12. Moreover, in the present embodiment, a direction corresponding to the term "lateral" is parallel to the Z direction, and a direction corresponding to the term "longitudinal" is parallel to a plane defined by the X direction and the Y direction. Specifically, the "lateral" insulating member 14 in the present embodiment passes through the heat-dissipating substrate 1 (along the Z direction) so as to separate the first heat-dissipating block 11, the second heat-dissipating block 12, and the heat-dissipating plate 13 from each other, thereby achieving a lateral insulation. In other words, the heat-dissipating block 11, the second heat-dissipating block 12, and the heat-dissipating plate 13 are not structurally and electrically connected to each other by the lateral insulating member 14. The "longitudinal" insulating member 15 in the present embodiment is substantially parallel to the plane defined by the X direction and the Y direction so as to separate a plurality of protrusions 113, 123, 133 from each other, thereby achieving a longitudinal insulation.

The heat-dissipating plate 13 in the present embodiment is in a substantial H shape, and has a first slot 131 and a second slot 132 both arranged on two opposite sides of the H shape. The first heat-dissipating block 11 is arranged in the first slot 131, and the first heat-dissipating block 11 and the first slot 131 define a first U-shaped gap 17 there-between. The second heat-dissipating block 12 is arranged in the second slot 132, and the second heat-dissipating block 12 and the second slot 132 define a second U-shaped gap 18 there-between. Moreover, a volume of the second heat-dissipating block 12 is smaller than that of the first heat-dissipating block 11.

Specifically, the first heat-dissipating block 11 has a first outer side wall 111 and a first inner side wall 112. The first outer side wall 111 is arranged on the first edge 1a of the heat-dissipating substrate 1, and the first inner side wall 112 faces an inner wall of the first slot 131, so that the first inner side wall 112 and the inner wall of the first slot 131 jointly define the first U-shaped gap 17. The second heat-dissipating block 12 has a second outer side wall 121 and a second inner side wall 122. The second outer side wall 121 is arranged on the second edge 1b of the heat-dissipating substrate 1, and the second inner side wall 122 faces an inner wall of the second slot 132, so that the second inner side wall 122 and the inner wall of the second slot 132 jointly define the second U-shaped gap 18.

Figure 7:
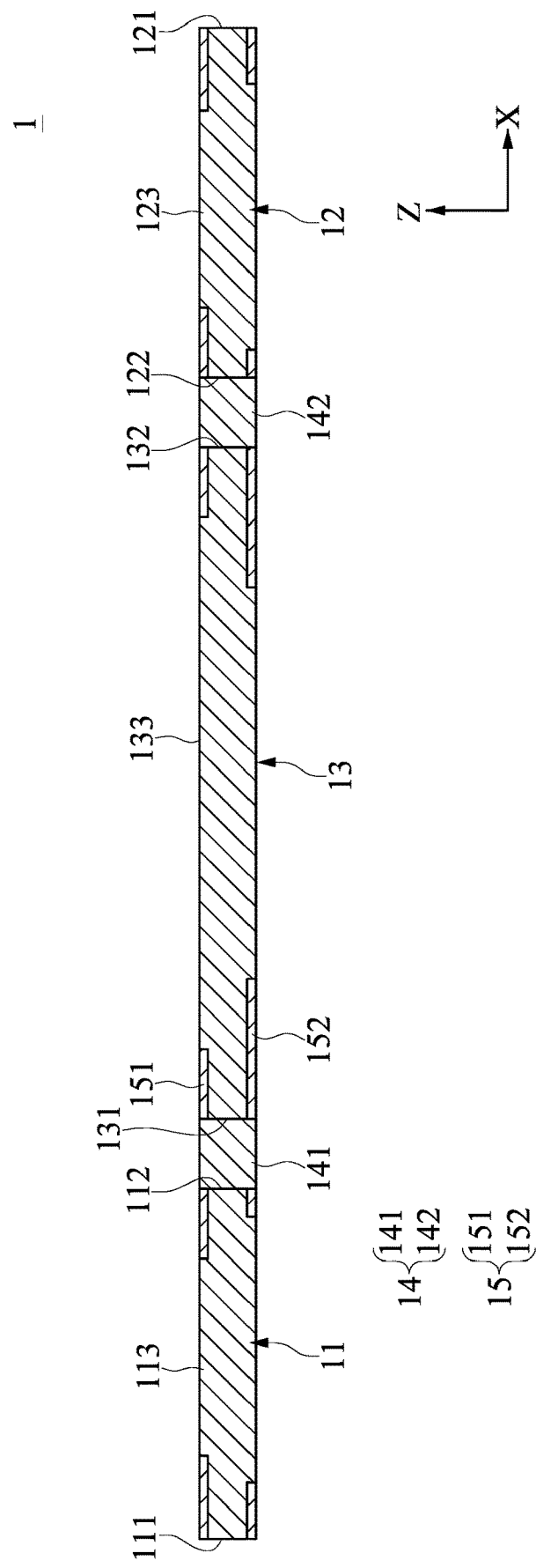
FIG. 7 is a cross-sectional view taken along a cross-sectional line VII-VII of FIG. 4.

Furthermore, the first heat-dissipating block 11 has two protrusions 113 respectively formed on two opposite surfaces thereof. The second heat-dissipating block 12 has two protrusions 123 respectively formed on two opposite surfaces thereof. The heat-dissipating plate 13 has two protrusions 133 respectively formed on two opposite surfaces thereof. Each of the protrusions 113, 123, 133 in the present embodiment is in a substantial rectangular shape, and has a height at a micro level. In the present embodiment, the height of each of the protrusions 113, 123, 133 is less than or equal to 30 μm, but the present disclosure is not limited thereto. The protrusions 113, 123, 133 arranged at the same side (i.e., the upper side or the lower side of the first heat-dissipating block 11, the second heat-dissipating block 12, and the heat-dissipating plate 13 as shown in FIG. 7) have end surfaces in a substantial coplanar arrangement.

In addition, the first heat-dissipating block 11 has two first notches 114 recessed in the first outer side wall 111. That is to say, the two first notches 114 are arranged on the first edge 1a of the heat-dissipating substrate 1. Each of the two first notches 114 in the present embodiment is in a substantial semi-circular shape, and the two first notches 114 are respectively arranged adjacent to two ends of the first U-shaped gap 17. The heat-dissipating plate 13 has two second notches 134 arranged on the second edge 1b of the heat-dissipating substrate 1. Each of the two second notches 134 in the present embodiment is in a substantial semi-circular shape, and the two second notches 134 are respectively arranged adjacent to two ends of the second U-shaped gap 18.

Figure 4:
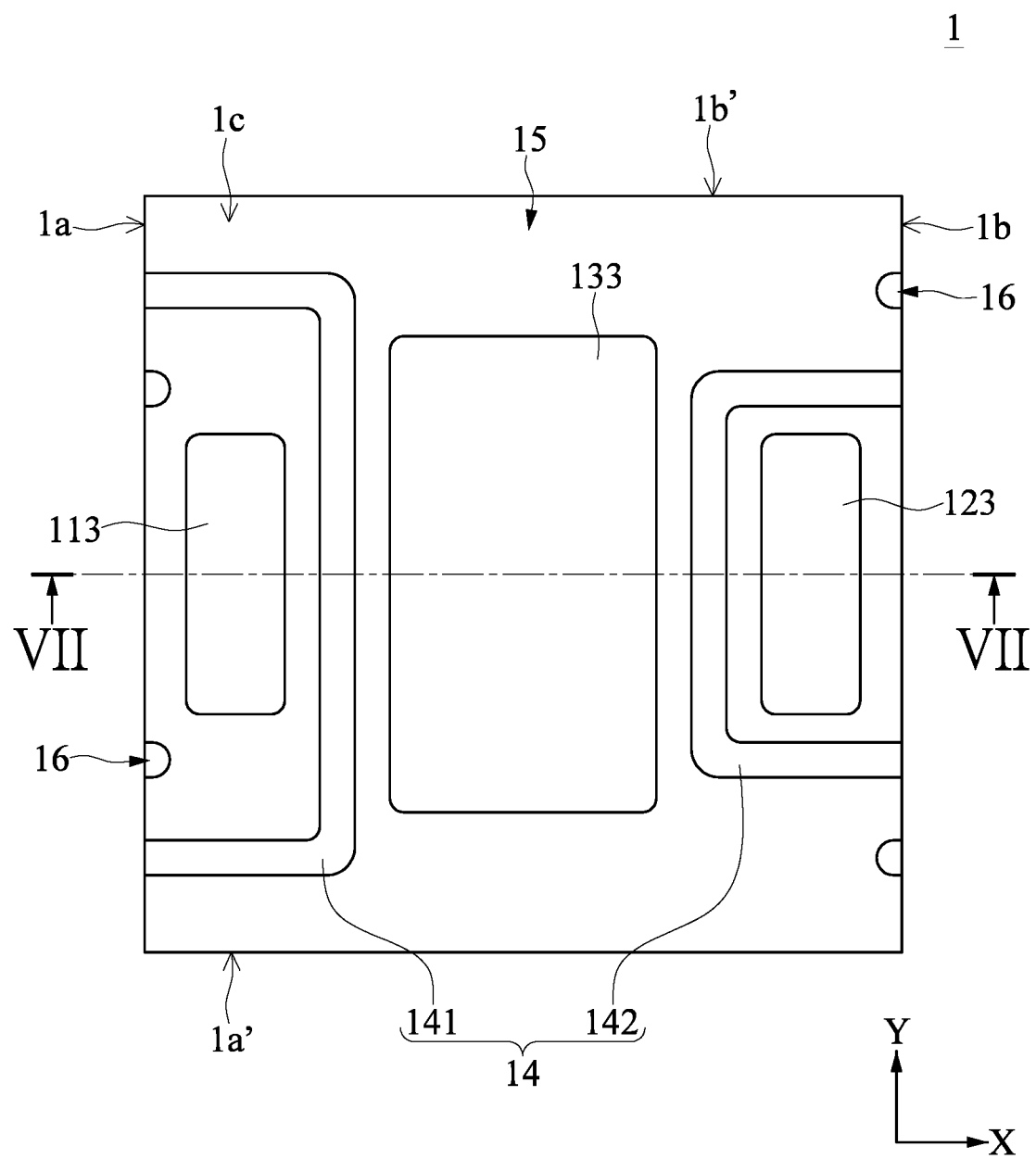
FIG. 4 is a planar view showing a heat-dissipating substrate according to the embodiment of the present disclosure.
Figure 5:
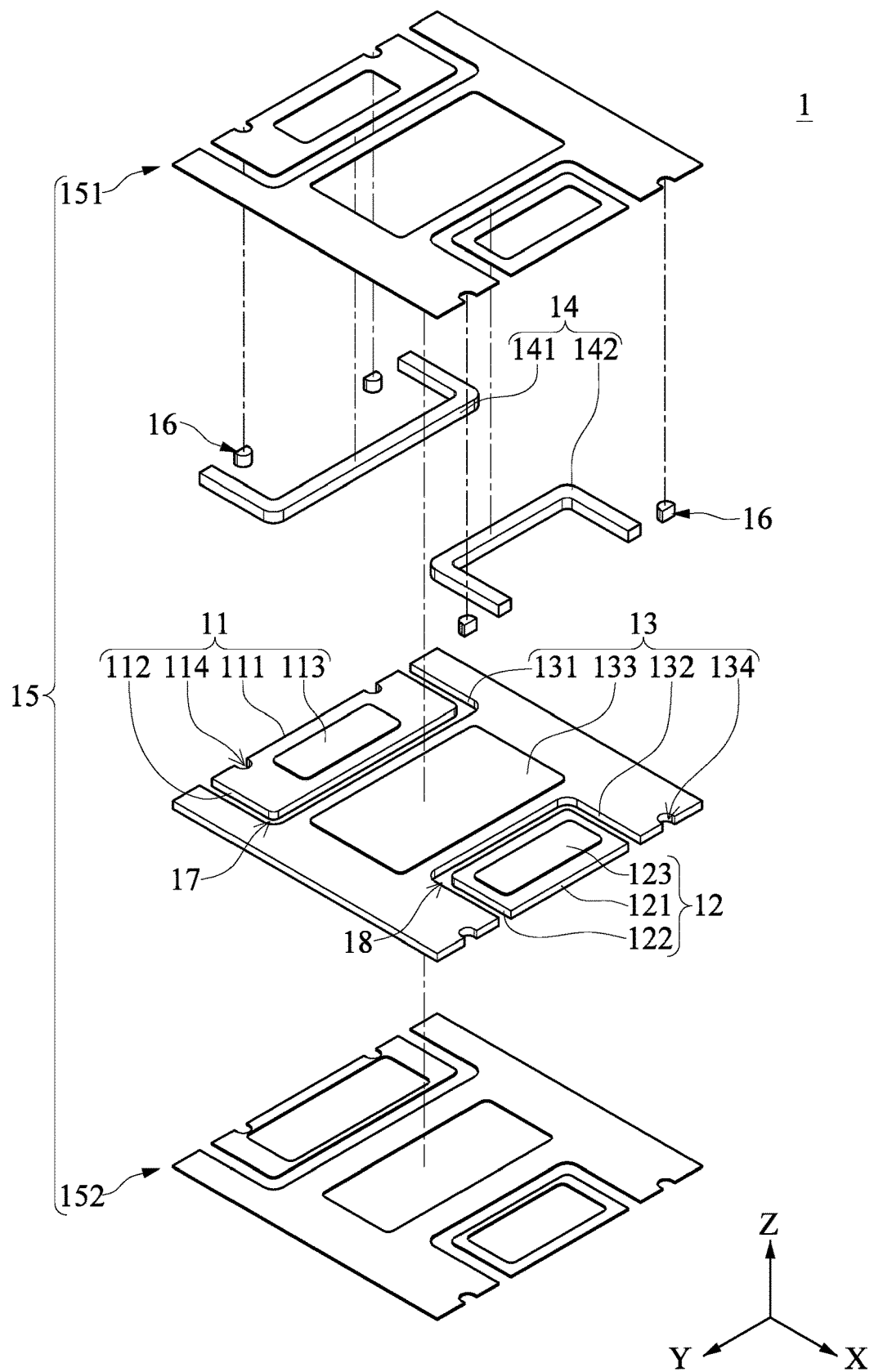
FIG. 5 is an exploded view of the heat-dissipating substrate.
Figure 6:
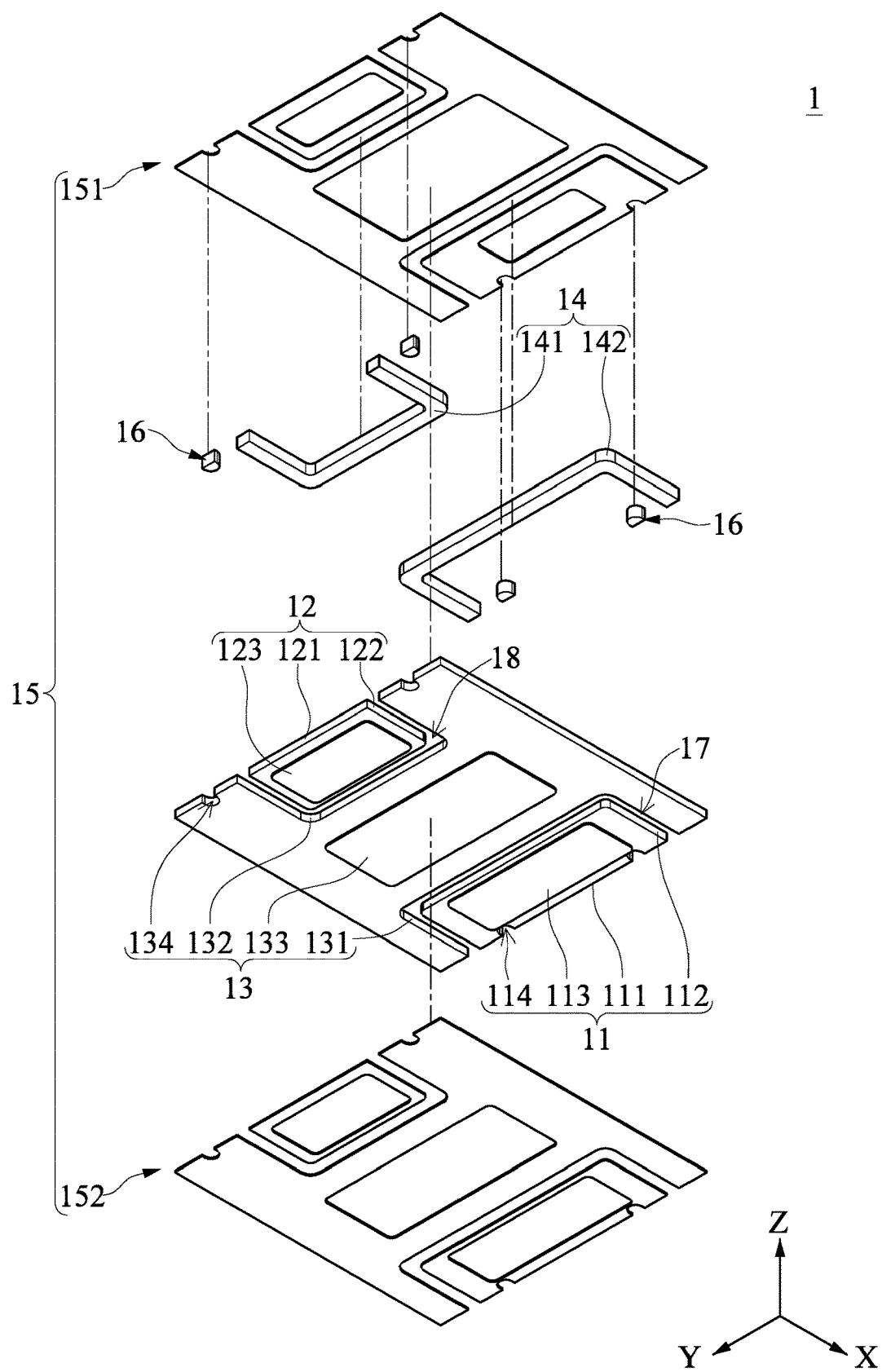
FIG. 6 is an exploded view of the heat-dissipating substrate from another perspective.

In addition, the heat-dissipating substrate 1 includes four insulating posts 16 respectively arranged in the two first notches 114 and the two second notches 134. Two of the insulating posts 16 in the two first notches 114 each have an outer side wall arranged on the first edge 1a, and the other two insulating posts 16 in the two second notches 134 each have an outer side wall arranged on the second edge 1b. A top surface and a bottom surface of each of the insulating posts 16 are respectively coplanar with the end surfaces of the two protrusions 133 of the heat-dissipating plate 13. Furthermore, the insulating posts 16 and the protrusions 113, 123, 133 arranged at the same side (i.e., the upper side or the lower side of the four insulating posts 16, the first heat-dissipating block 11, the second heat-dissipating block 12, and the heat-dissipating plate 13 as shown in FIG. 4) have end surfaces in a substantial coplanar arrangement. The material of each of the insulating posts 116 can be a thermosetting polymer (e.g., a thermal curable permanent hole-plugging material).

The material of the lateral insulating member 14 in the present embodiment is a thermosetting polymer (e.g., a thermal curable permanent hole-plugging material). The lateral insulating member 14 is arranged between the first heat-dissipating block 11 and the heat-dissipating plate 13, and is arranged between the second heat-dissipating block 12 and the heat-dissipating plate 13, thereby electrically isolating the first heat-dissipating block 11, the second heat-dissipating block 12, and the heat-dissipating plate 13 from each other. The lateral insulating member 14 includes a first insulator 141 and a second insulator 142 separated from the first insulator 141.

The first insulator 141 of the present embodiment is in a U shape and is disposed between the first heat-dissipating block 11 and the heat-dissipating plate 13, and two ends of the first insulator 141 are arranged on the first edge 1a of the heat-dissipating substrate 1. That is to say, the first insulator 141 is arranged in the first U-shaped gap 17, and is connected to the first inner side wall 112 and the inner wall of the first slot 131, so that the first heat-dissipating block 11 and the heat-dissipating plate 13 are electrically isolated from each other by the first insulator 141. Moreover, a top surface and a bottom surface of the first insulator 141 are respectively coplanar with the end surfaces of the two protrusions 113 of the first heat-dissipating block 11.

The second insulator 142 of the present embodiment is in a U shape and is disposed between the second heat-dissipating block 12 and the heat-dissipating plate 13, and two ends of the second insulator 142 are arranged on the second edge 1b of the heat-dissipating substrate 1. That is to say, the second insulator 142 is arranged in the second U-shaped gap 18, and is connected to the second inner side wall 122 and the inner wall of the second slot 132, so that the second heat-dissipating block 12 and the heat-dissipating plate 13 are electrically isolated from each other by the second insulator 142. Moreover, a top surface and a bottom surface of the second insulator 142 are respectively coplanar with the end surfaces of the two protrusions 123 of the second heat-dissipating block 12.

The material of the longitudinal insulating member 15 in the present embodiment is a thermoplastic polymer (e.g., a thermoplastic resin). The longitudinal insulating member 15 covers (or is adhered to) the two opposite surfaces of the first heat-dissipating block 11, the two opposite surfaces of the second heat-dissipating block 12, the two opposite surfaces of the heat-dissipating plate 13, and side walls of each of the protrusions 113, 123, 133. A top surface and a bottom surface of the longitudinal insulating member 15 are respectively coplanar with the end surfaces of the protrusions 113, 123, 133. The longitudinal insulating member 15 of the present embodiment includes a first insulating film 151 and a second insulating film 152 separated from the first insulating film 151. The first insulating film 151 and the second insulating film 152 respectively surround the side walls of the protrusions 113, 123, 133.

Furthermore, the longitudinal insulating member 15 and the protrusions 113, 123, 133 (and the lateral insulating member 14) jointly define at least part of the top plane 1c and at least part of the bottom plane 1d of the heat-dissipating substrate 1. Specifically, in the present embodiment, the longitudinal insulating member 15, the protrusions 113, 123, 133, the lateral insulating member 14, and the insulating posts 16 in the present embodiment jointly define the top plane 1c and the bottom plane 1d of the heat-dissipating substrate 1 (as shown in FIG. 3), but the present disclosure is not limited thereto.

When the heat-dissipating substrate 1 of the present embodiment is tested under a testing environment of 1000 mA and 25° C., a heat resistance of the heat-dissipating substrate 1 is substantially less than that of an aluminum nitride substrate by 70% and is substantially less than that of a circuit board (i.e., a FR4 board) by 90%. Moreover, the cost of the heat-dissipating substrate 1 in the present embodiment is lower than that of an aluminum nitride substrate by 95%.

The above description discloses the structure of the heat-dissipating substrate 1 of the present embodiment. The heat-dissipating substrate 1 of the present embodiment can be applied according to design requirements, and is not limited to being applied to the LED package structure 100. The following description describes the other components of the LED package structure 100.

As shown in FIGS. 2, 3, 8, and 9, the electrode layer 3 and the soldering layer 2 are respectively disposed on the top plane 1c and the bottom plane 1d of the heat-dissipating substrate 1. The electrode layer 3 and the soldering layer 2 are respectively connected to the protrusions 113, 123, 133, thereby establishing an electrical connection there-between through the first heat-dissipating block 11, the second heat-dissipating block 12, and the heat-dissipating plate 13.

Specifically, the soldering layer 2 in the present embodiment includes three soldering pads 21 spaced apart from each other. The three soldering pads 21 respectively abut against three of the protrusions 113, 123, 133 arranged on the bottom plane 1d of the heat-dissipating substrate 1. Preferably, the three protrusions 113, 123, 133 arranged on the bottom plane 1d of the heat-dissipating substrate 1 are entirely covered by the three soldering pads 21.

Figure 8:
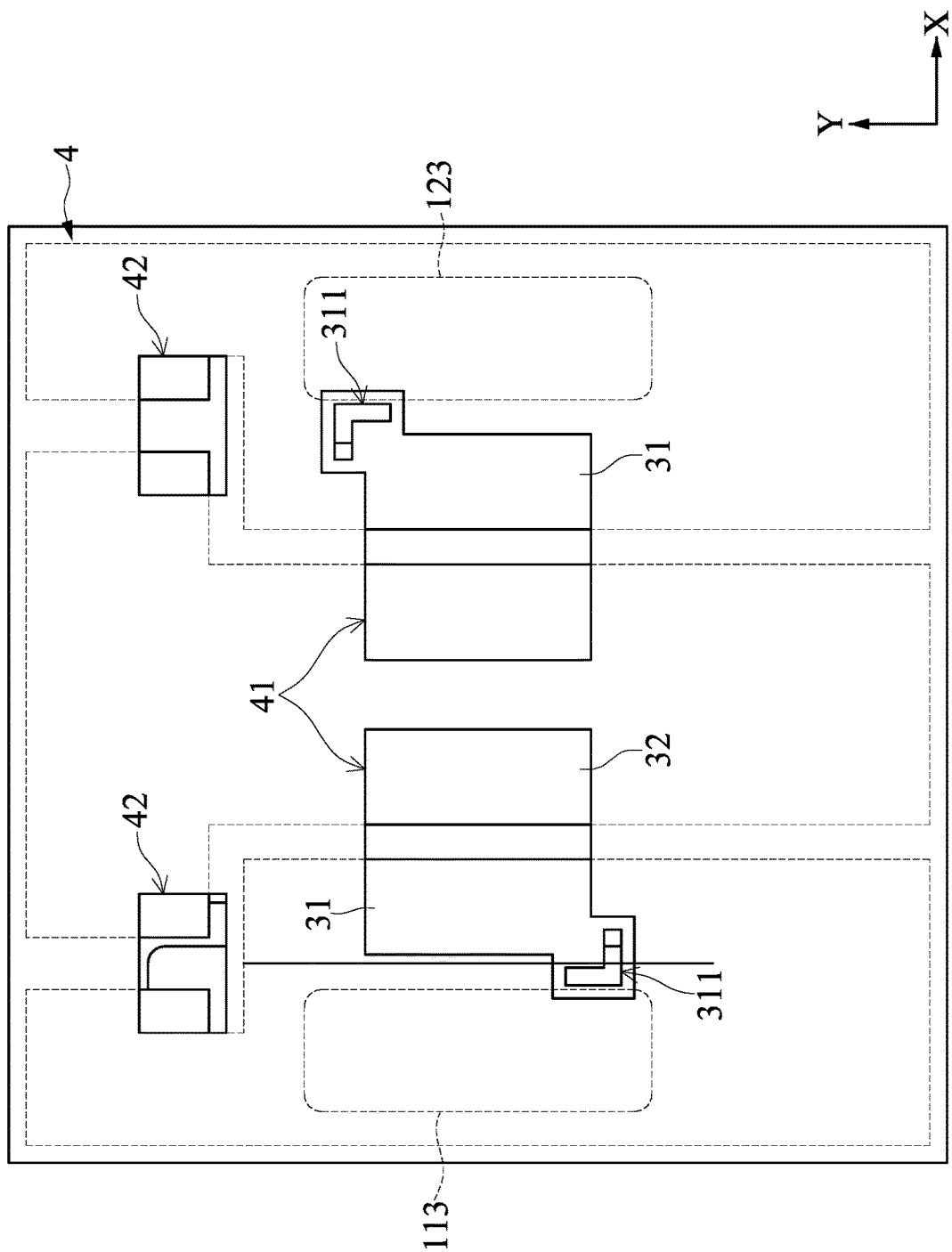
FIG. 8 is a top schematic view of FIG. 1, in which a part of the LED package structure is omitted.

Moreover, the electrode layer 3 includes two side electrode sheets 31 and a central electrode sheet 32 disposed between and spaced apart from the two side electrode sheets 31. The two side electrode sheets 31 and the central electrode sheet 32 respectively abut against three of the protrusions 113, 123, 133 arranged on the top plane 1c of the heat-dissipating substrate 1. Preferably, the three protrusions 113, 123, 133 arranged on the top plane 1c of the heat-dissipating substrate 1 are entirely covered by the three electrode sheets 31, 32. Therefore, the LED package structure 100 adapts the soldering layer 2 and the electrode layer 3 to be disposed on the protrusions 113, 123, 133, thereby providing a large heat-dissipating area to the light emitting units 5 and effectively solving the drawbacks associated with different sizes of upper and lower circuits. The two side electrode sheets 31 of the electrode layer 3 each have an L-shaped positioning symbol 311. Inner corners of the two L-shaped positioning symbols 311 face each other for positioning the light-emitting units 5. The positioning symbol 311 of each of the two side electrode sheets 31 does not expose the adjacent protrusion 113, 123 therefrom (as shown in FIG. 8).

The reflective solder mask layer 4 can be a white paint having a high reflectivity that is larger than 80% for reflecting light having a wavelength of 450 nm. The reflective solder mask layer 4 is disposed on the top plane 1c of the heat-dissipating substrate 1, and the electrode layer 3 is embedded in the reflective solder mask layer 4. The reflective solder mask layer 4 has two first openings 41 and two second openings 42, and a part of the electrode layer 3 is exposed from the reflective solder mask layer 4 via the two first openings 41 and the two second openings 42. The two first openings 41 are arranged at a substantial central portion of the reflective solder mask layer 4, and the two second openings 42 are arranged at one side of the reflective solder mask layer 4 and are respectively adjacent to two corners of the reflective solder mask layer 4. The two first openings 41 each expose a part of the central electrode sheet 32, and the two first openings 41 respectively expose parts of the two side electrode sheets 31. The two positioning symbols 311 are respectively exposed from the reflective solder mask layer 4 via the two first openings 41. The two second openings 42 each expose a part of the central electrode sheet 32, and the two second openings 42 respectively expose parts of the two side electrode sheets 31. Therefore, the reflective solder mask layer 4 can be used for increasing the lighting efficiency of the LED package structure 100.

The two light emitting units 5 in the present embodiment can be two LED chips or two chip scale package (CSP) structures. The CSP structure includes an LED chip and a fluorescent layer covering a top surface (and/or side surfaces) of the LED chip. The two light emitting units 5 can have a cold-warm dual color temperature (e.g., the dual color temperature has a first range of 4000-9000K and a second range of 1500-4000K) or the same color temperature. Each of the two light emitting units 5 has an optical center, and a distance D between the optical centers of the two light emitting units 5 is preferably within a range of 1.5-2.0 mm.

The two light emitting units 5 are respectively arranged in the two first openings 41 of the reflective solder mask layer 4, and each of the two light emitting units 5 is fixed on a corresponding portion of the electrode layer 3 (i.e., each of the two light emitting units 5 is fixed on the central electrode sheet 32 and the corresponding side electrode sheet 31) by using a surface mounted technology (SMT). Two diagonal corners of the two light emitting units 5 arranged distant from each other are respectively aligned with the inner corners of the two L-shaped positioning symbols 311.

Each of the two light emitting units 5 has two electrodes 51, 51'. The two adjacent electrodes 51 of the two light emitting units 5 are disposed on the central electrode sheet 32, and the other two electrodes 51' of the two light emitting units 5 are respectively disposed on the two side electrode sheets 31. Therefore, the two light emitting units 5 are electrically connected to each other through the electrode layer 3, and the two light emitting units 5 can be parallely connected in a P-N/N-P mode or an N-P/P-N mode.

Figure 9:
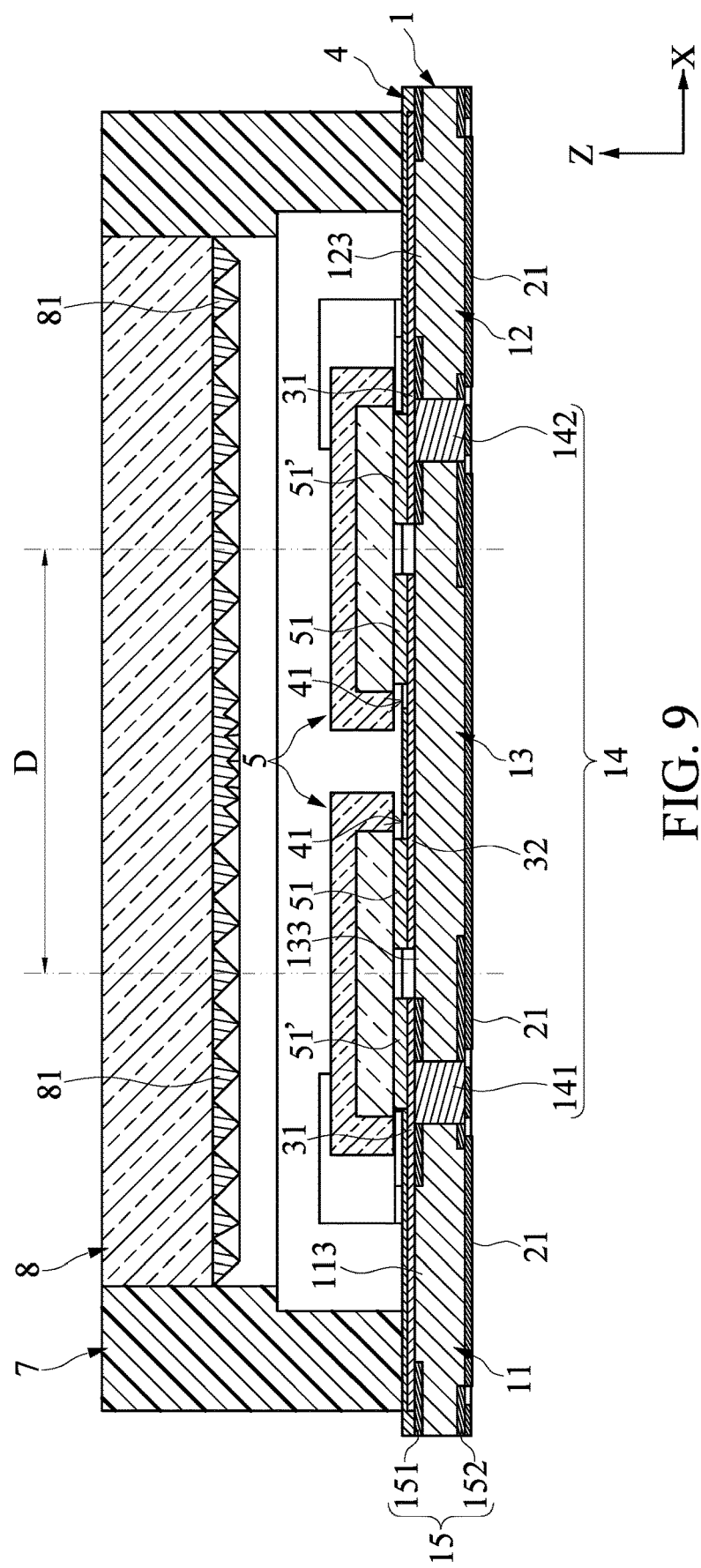
FIG. 9 is a cross-sectional view taken along a cross-sectional line IX-IX of FIG. 1.

Specifically, each of the two light emitting units 5 is preferably soldered onto the electrode layer 3 by a solder paste having a melting point within a range of 120-300° C., and the material of the solder paste can be Au/Sn, Sn/Sb, or Sn/Ag/Cu, but the present disclosure is not limited thereto. Moreover, as shown in FIG. 9, inner edges of the two adjacent electrodes 51 of the two light emitting units 5 are respectively flush with two opposite outer edges of the central electrode sheet 32, and inner edges of the other two electrodes 51' of the two light emitting units 5 are respectively flush with two adjacent inner edges of the two side electrode sheets 31, thereby effectively increasing the heat-dissipating performance of the LED package structure 100.

In addition, the two TVS diodes 6 are respectively arranged in the two second openings 42 of the reflective solder mask layer 4, and each of the two TVS diodes 6 is fixed on a corresponding portion of the electrode layer 3 (i.e., each of the two TVS diodes 6 is fixed on the central electrode sheet 32 and the corresponding side electrode sheet 31) by using a SMT. Therefore, the two TVS diodes 6 can be used to respectively protect the two light emitting units 5, and the position of the two TVS diodes 6 can effectively prevent the two TVS diodes 6 from shielding light emitted from the two light emitting units 5. Moreover, the TVS diodes 6 and the light emitting units 5 in the present embodiment are mounted onto the electrode layer 3 by the same SMT manner, so that the manufacturing process of the LED package structure 100 is more consistent.

The reflective housing 7 is adhered to the reflective solder mask layer 4, and the two light emitting units 5 and the two TVS diodes 6 are arranged in a space surrounded by the optical member 8 and the reflective housing 7. The reflective housing 7 in the present embodiment is in a substantial rectangular ring shape, and the optical member 8 is fixed to top inner edges of the reflective housing 7.

Specifically, the optical member 8 has two Fresnel lenses 81 or an assembly of two Fresnel lenses 81. An outer surface of the optical member 8 is a planar surface, and an inner surface of the optical member 8 is formed with the two Fresnel lenses 81. Moreover, centers of the two Fresnel lenses 81 respectively correspond in position to the optical centers of the two light emitting units 5. That is to say, a distance between the centers of the two Fresnel lenses 81 is within a range of 1.5-2.0 mm to provide better lighting efficiency, but the present disclosure is not limited thereto.

Method for Manufacturing Heat-Dissipating Substrate

The LED package structure 100 of the present embodiment is disclosed in the above description. Referring to FIGS. 10 to 19, the present embodiment also provides a method for manufacturing the heat-dissipating substrate 1. The heat-dissipating substrate 1 of the LED package structure 100 can be manufactured by carrying out the method, but the present disclosure is not limited thereto. The method includes steps S110 to S170 substantially disclosed as follows.

Figure 10:
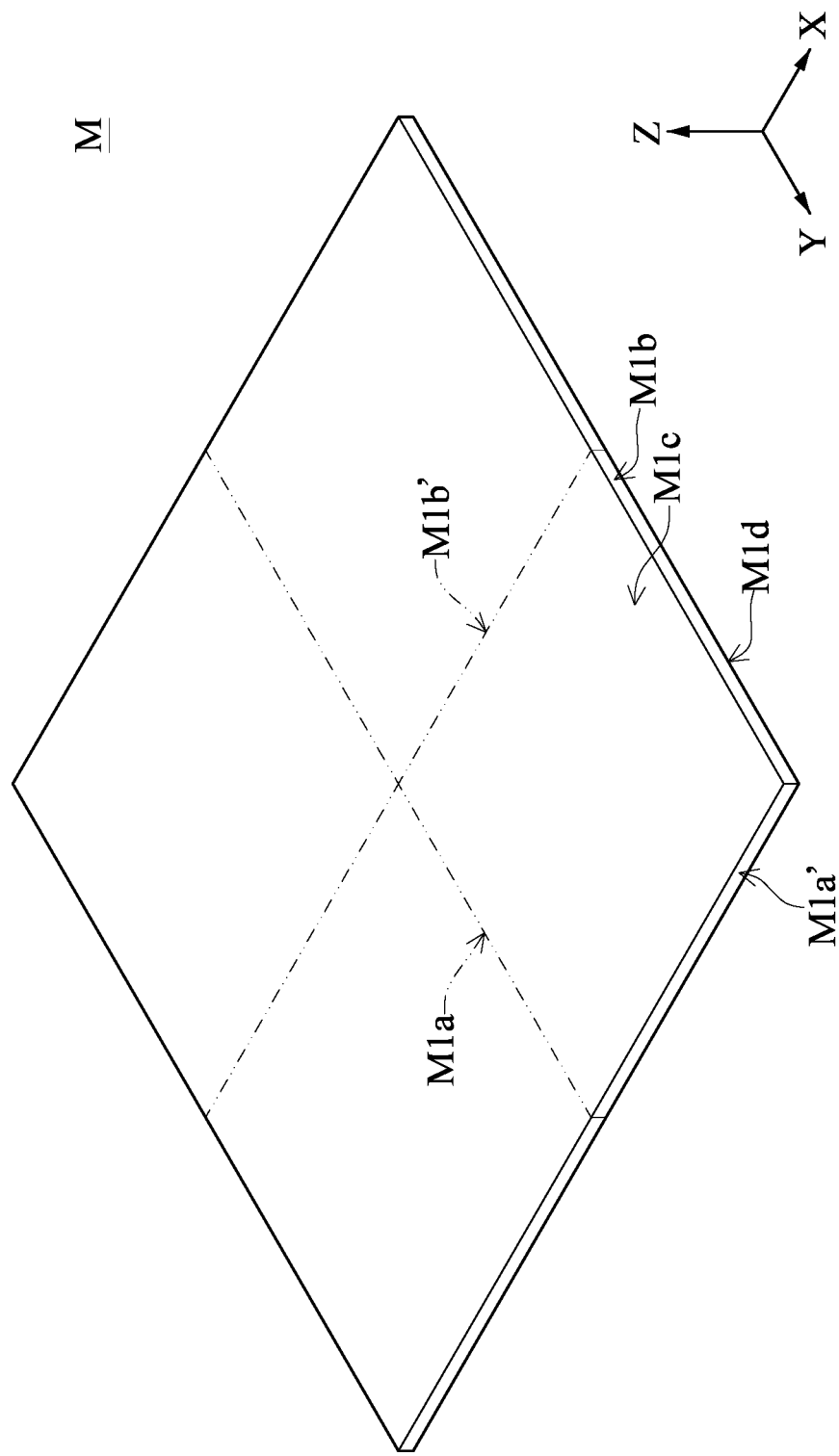
FIG. 10 is a perspective view showing step S110 of a method for manufacturing the heat-dissipating substrate according to the embodiment of the present disclosure.

As shown in FIG. 10, the step S110 is carried out by providing a metal plate M having a thickness about 200 μm. The metal plate M in the present embodiment is a rectangular copper plate, and the metal plate M has a top surface M1c and a bottom surface M1d opposite to the top surface M1c. Specifically, the metal plate M can be defined as a plurality of metal regions for respectively being formed into a plurality of heat-dissipating substrates 1. Each of the metal regions has a first boundary M1a, a second boundary M1b opposite to the first boundary M1a, a third boundary M1a', and a fourth boundary M1b' opposite to the third boundary M1a'.

It should be noted that the method can be carried out to form a plurality of heat-dissipating substrates 1 at the same time, and the heat-dissipating substrates 1 are of the same structure. Although the figures show the manufacturing steps of the plurality of heat-dissipating substrates 1, the following description discloses the manufacturing steps of just one of the heat-dissipating substrates 1 for the sake of brevity. In other words, the metal plate M disclosed in the following description can be regarded as one of the metal regions.

Figure 11:
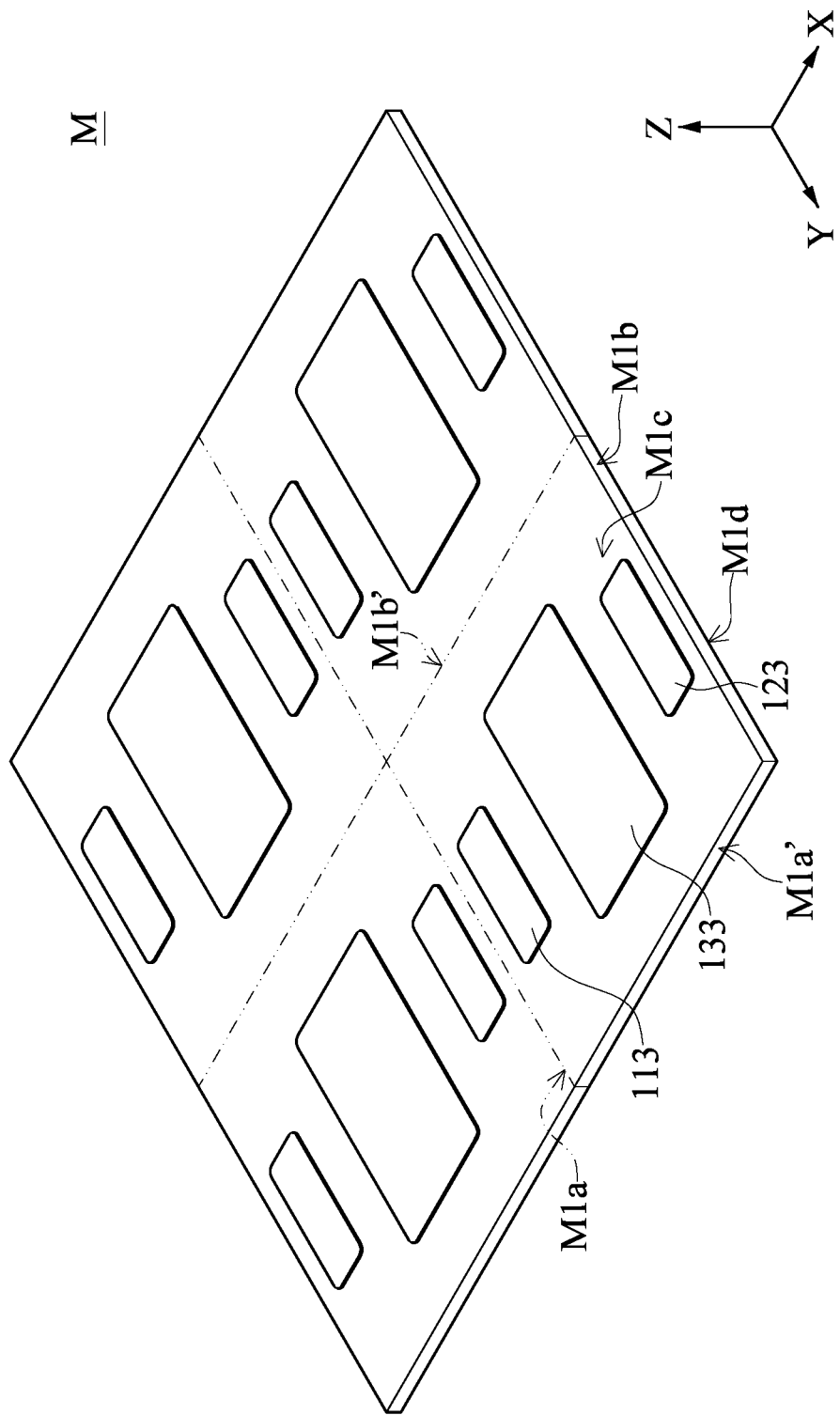
FIG. 11 is a perspective view showing step S120 of the method according to the embodiment of the present disclosure.

As shown in FIG. 11, the step S120 is carried out by implementing a micro-etching process on the top surface M1c and the bottom surface M1d of the metal plate M so as to form a plurality of protrusions 113, 123, 133. Specifically, an etching depth of the micro-etching process is at a micro level and is smaller than the thickness of the metal plate M. For example, the height of each of the protrusions 113, 123, 133 is less than or equal to 30 μm, but the present disclosure is not limited thereto.

Figure 12:
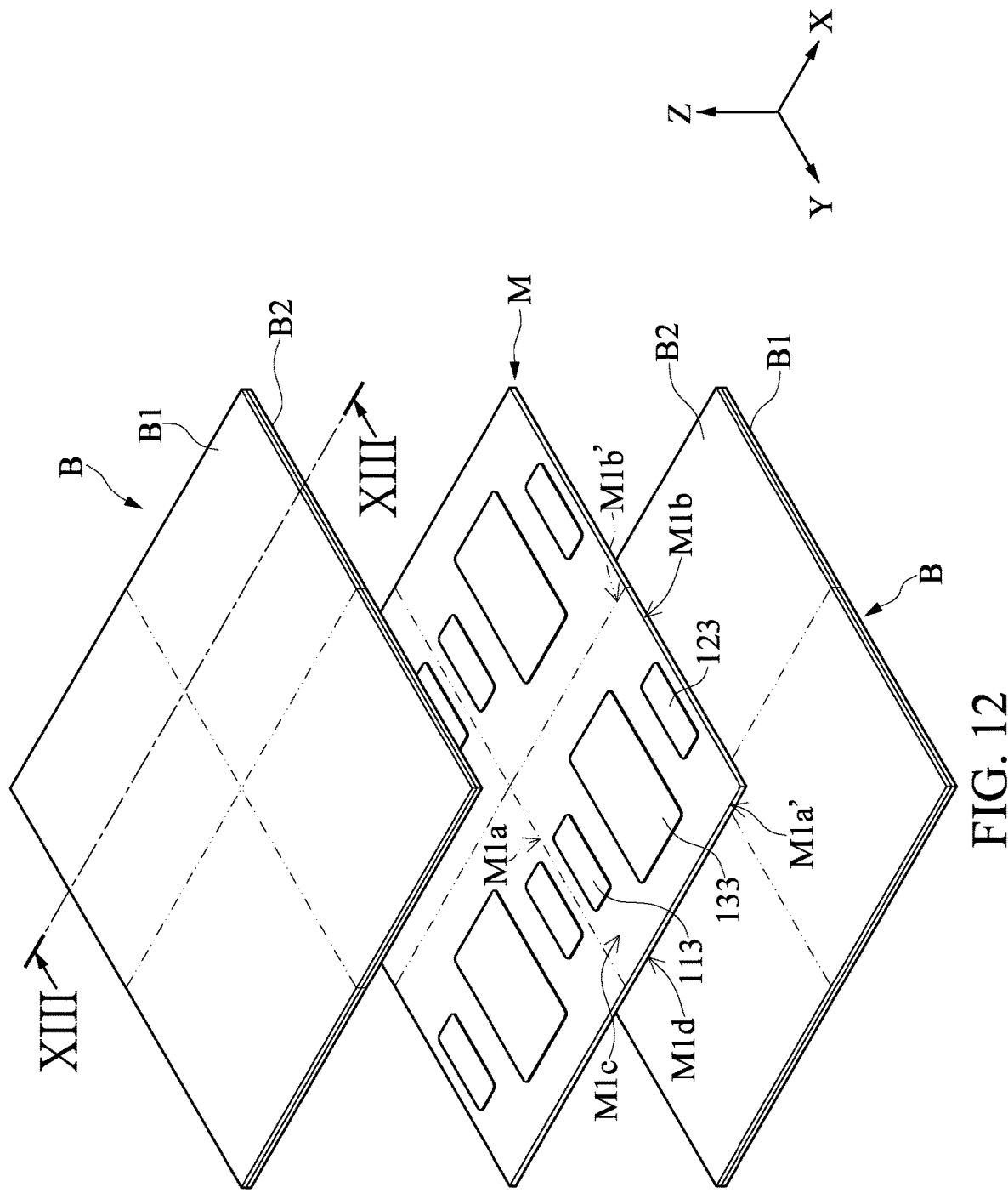
FIG. 12 is a perspective view showing steps S130 and S140 of the method according to the embodiment of the present disclosure and FIG. 13 is a cross-sectional view taken along a cross-sectional line XIII-XIII of FIG. 12.
Figure 13:
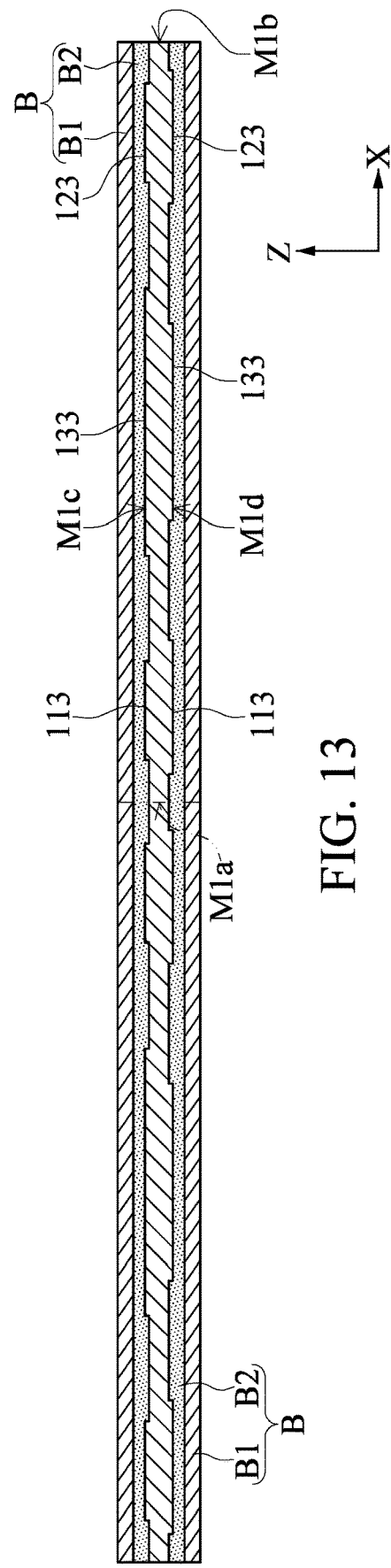

As shown in FIGS. 12 and 13, the step S130 is carried out by providing two adhesive plates B (i.e., resin coated copper, RCC) each having a copper foil layer B1 and a resin layer B2 adhered to the copper foil layer B1. Specifically, the resin layer B2 in the present embodiment is a thermoplastic resin, and the resin layers B2 of the two adhesive plates B respectively face the top surface M1c and the bottom surface M1d of the metal plate M.

As shown in FIGS. 12 and 13, the step S140 is carried out by respectively hot-pressing the two adhesive plates B onto the top surface M1c and the bottom surface M1d of the metal plate M, so that the two resin layers B2 are deformed to respectively surround side walls of the protrusions 113, 123, 133.

Figure 14:
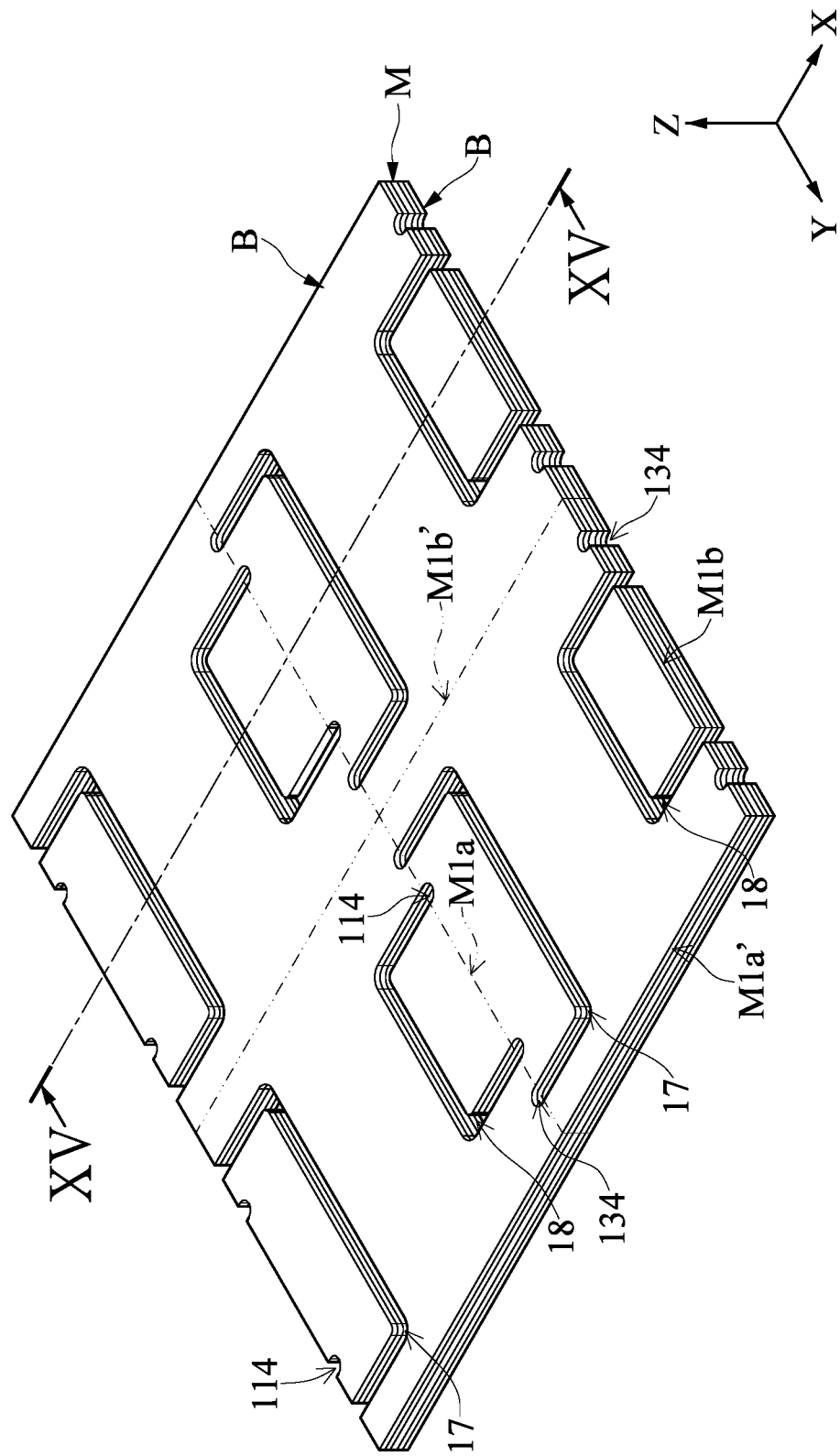
FIG. 14 is a perspective view showing step S150 of the method according to the embodiment of the present disclosure and FIG. 15 is a cross-sectional view taken along a cross-sectional line XV-XV of FIG. 14.
Figure 15:
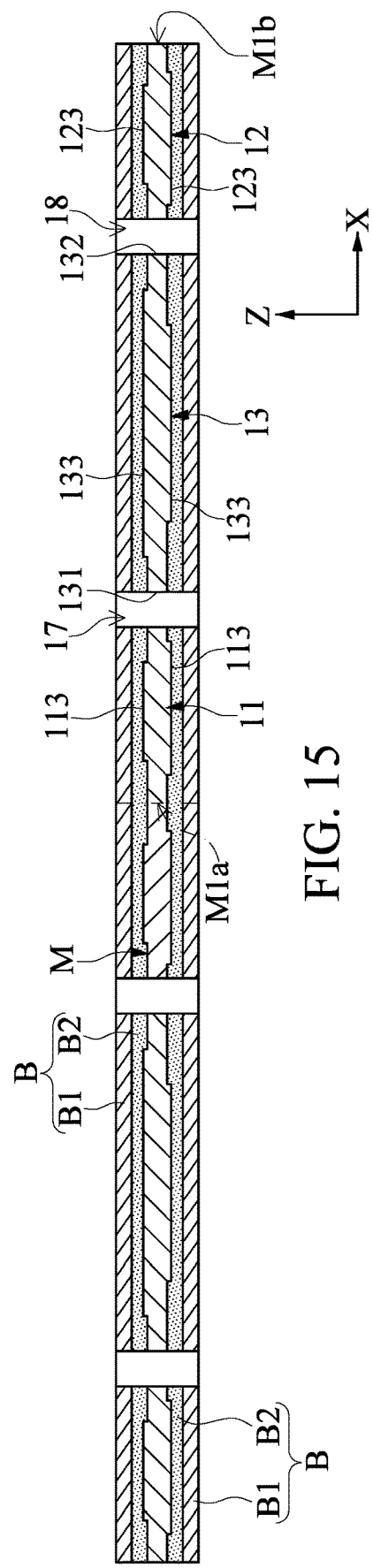

As shown in FIGS. 14 and 15, the step S150 is carried out by implementing an etching process on the metal plate M and the two adhesive plates B adhered to the metal plate M so as to form a first heat-dissipating block 11, a second heat-dissipating block 12, and a heat-dissipating plate 13 spaced apart from each other.

Specifically, the heat-dissipating plate 13 is etched to form a first slot 131 and a second slot 132 both respectively arranged on two opposite sides thereof. The first heat-dissipating block 11 is arranged in the first slot 131, and the first heat-dissipating block 11 and the first slot 131 defines a first U-shaped gap 17 there-between. The second heat-dissipating block 12 is arranged in the second slot 132, and the second heat-dissipating block 12 and the second slot 132 defines a second U-shaped gap 18 there-between.

Moreover, the first heat-dissipating block 11 is etched to form two first notches 114, and the two first notches 114 and two ends of the first U-shaped gap 17 are arranged on the first boundary M1a of the metal plate M. The heat-dissipating plate 13 is etched to form two second notches 134, and the two second notches 134 and two ends of the second U-shaped gap 18 are arranged on the second boundary M1b of the metal plate M. Two projected regions defined by orthogonally projecting the two first notches 114 onto the second boundary M1b respectively overlap with the two ends of the second U-shaped gap 18, and two projected regions defined by orthogonally projecting the two second notches 134 onto the first boundary M1a respectively overlap with the two ends of the first U-shaped gap 17.

In other words, in any two metal regions connected to each other, the first boundary M1a of one of the any two metal regions (hereafter referred to as a first metal region) overlaps with the second boundary M1b of the other metal region (hereafter referred to as a second metal region), so that the two first notches 114 of the first metal region are respectively in spatial communication with two ends of the second U-shaped slot 18 of the second metal region, and two ends of the first U-shaped slot 17 of the first metal region are respectively in spatial communication with the two second notches 134 of the second metal region.

Figure 16:
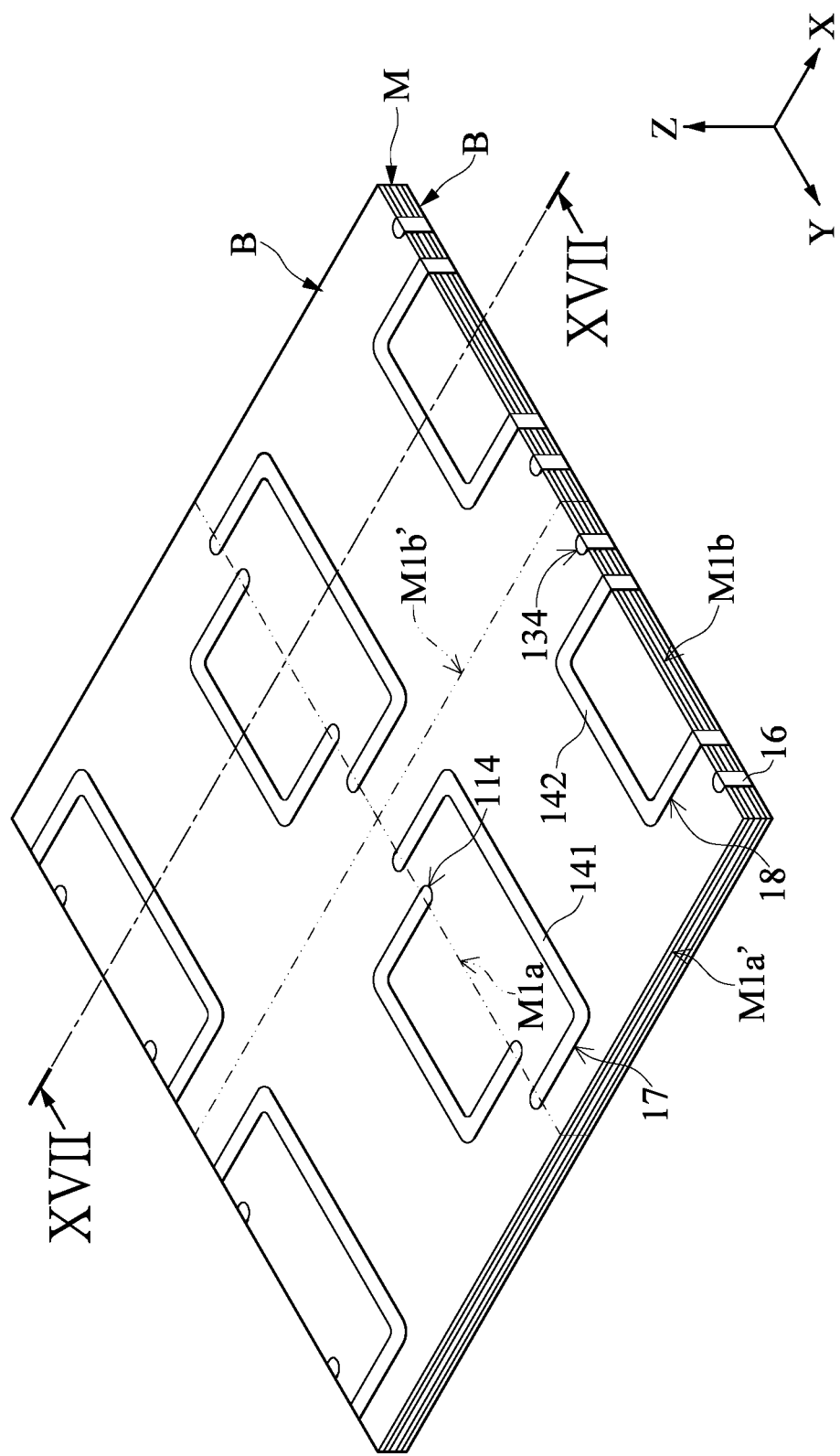
FIG. 16 is a perspective view showing step S160 of the method according to the embodiment of the present disclosure and FIG. 17 is a cross-sectional view taken along a cross-sectional line XVII-XVII of FIG. 16.
Figure 17:
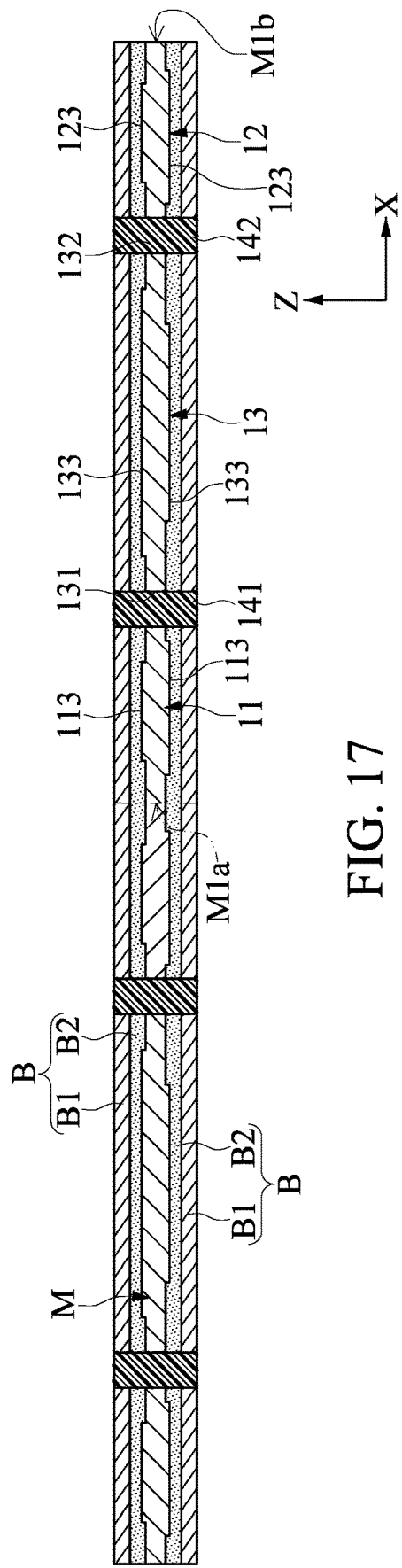

As shown in FIGS. 16 and 17, the step S160 is carried out by filling an insulating material between the heat-dissipating plate 13 and the first heat-dissipating block 11 and between the heat-dissipating plate 13 and the second heat-dissipating block 12 so as to electrically isolate the heat-dissipating plate 13, the first heat-dissipating block 11, and the second heat-dissipating block 12 from each other.

Specifically, the insulating material in the present embodiment is a thermosetting polymer (e.g., a thermal curable permanent hole-plugging material). The insulating material is filled in the first U-shaped slot 17 and the second U-shaped slot 18 to respectively form a U-shaped first insulator 141 and a U-shaped second insulator 142. Moreover, the insulating material is also filled in the two first notches 114 and the two second notches 134 to respectively form four insulating posts 16. Furthermore, the two ends of the first U-shaped slot 17 and the two ends of the second U-shaped slot 18 respectively face two opposite directions away from each other, and the larger first U-shaped slot 17 and the smaller second U-shaped slot 18 are cooperated with the four insulating posts 16, thereby solving an island effect of any two metal regions connected to each other. In other words, in any two metal regions connected to each other, the first insulator 141 of one of the any two metal regions (hereafter referred as a first metal region) is integrally connected to two of the insulating posts 16 of the other metal region (hereafter referred as a second metal region) arranged in the two second notches 134, and two of the insulating posts 16 of the first metal region arranged in the two first notches 114 are integrally connected to the second insulator 142 of the second metal region.

Figure 18:
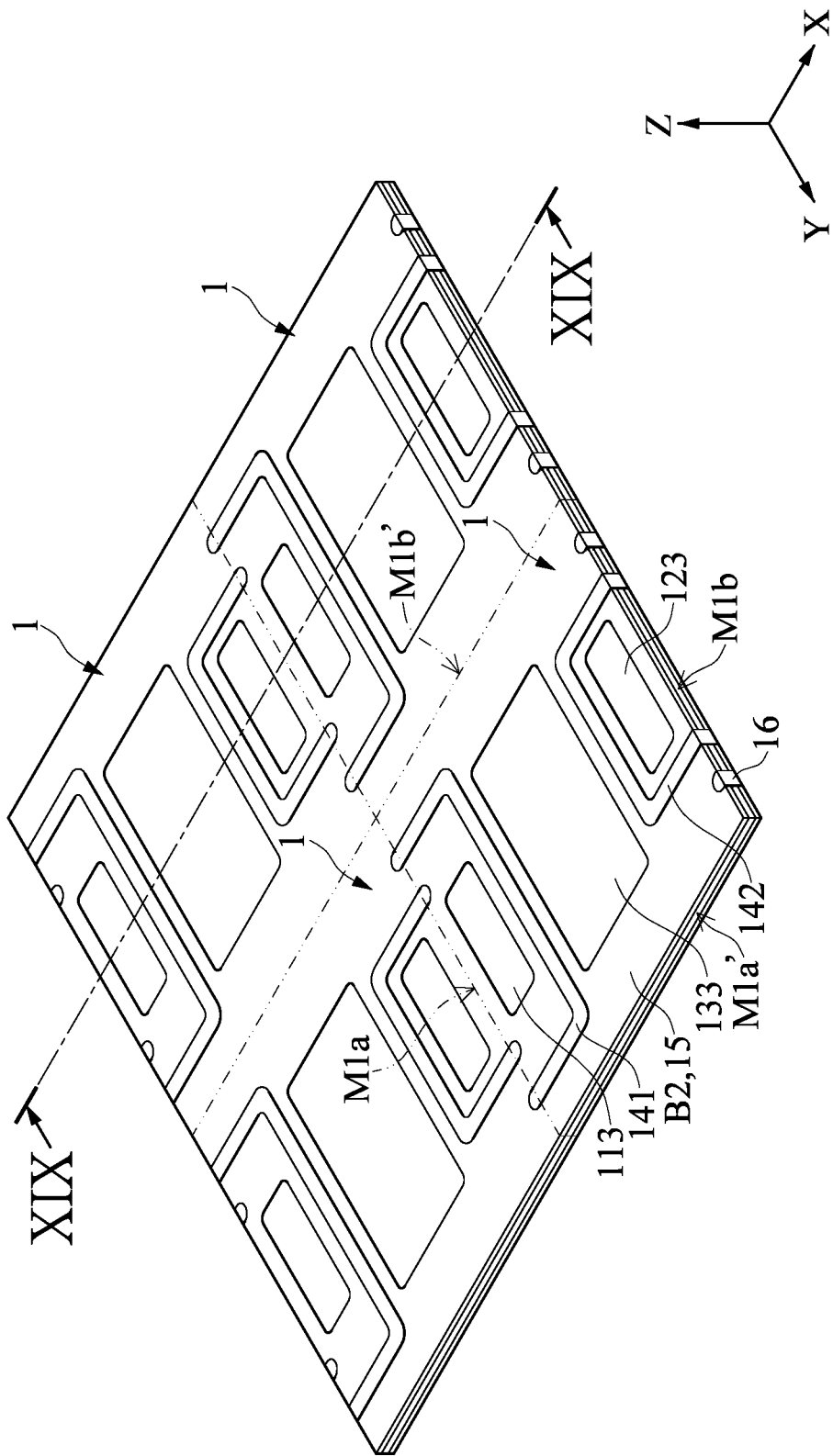
FIG. 18 is a perspective view showing step S170 of the method according to the embodiment of the present disclosure and FIG. 19 is a cross-sectional view taken along a cross-sectional line XIX-XIX of FIG. 18.
Figure 19:
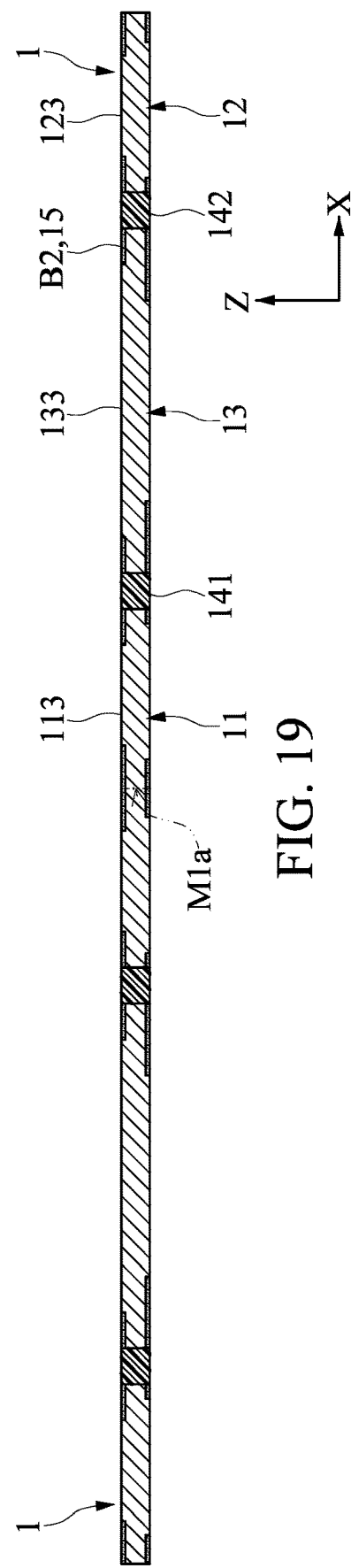

As shown in FIGS. 18 and 19, the step S170 is carried out by removing the copper foil layers B1 of the two adhesive plates B so as to expose the protrusions 113, 123, 133 and the two resin layers B2 from the resin layers B2. After the step S170 is carried out, the two resin layers B2 can be named as a longitudinal insulating member 15. The copper foil layers B1 of the two adhesive plates B can be removed by etching or polishing.

In other words, after the step S170 is carried out, the metal regions of the metal plate M and the structures formed thereon can be sliced to form a plurality of heat-dissipating substrates 1.

The Effects Associated with the Present Embodiment

In summary, for the LED package structure, the heat-dissipating substrate, and the method of the present disclosure, the lateral insulating member (i.e., the first insulator and the second insulator) is provided to electrically isolate the first heat-dissipating block, the second heat-dissipating block, and the heat-dissipating plate from each other, so that the heat-dissipating substrate can be formed with an electrically conductive property. The first heat-dissipating block, the second heat-dissipating block, and the heat-dissipating plate occupy a greater portion of the heat-dissipating substrate, so that the heat-dissipating substrate can be formed with a better thermally conductive property.

Moreover, a greater portion of the first heat-dissipating block, the second heat-dissipating block, and the heat-dissipating plate excluding the end surfaces of the protrusions is covered by the longitudinal insulating member, so that an electrical connection between the heat-dissipating substrate and other components can only be achieved by the protrusions.

The heat-dissipating substrate has a large heat-dissipating area by forming the H-shaped heat-dissipating plate. The larger first U-shaped slot and the smaller second U-shaped slot, which are formed by the first heat-dissipating block, the second heat-dissipating block, and the heat-dissipating plate, are cooperated with the four insulating posts, thereby solving an island effect of any two metal regions connected to each other.

The LED package structure adapts the soldering layer and the electrode layer to be disposed on the protrusions, thereby providing a large heat-dissipating area to the light emitting units and effectively solving the drawbacks associated with upper and lower circuits having different sizes.

When the heat-dissipating substrate of the present disclosure is tested under a testing environment of 1000 mA and 25° C., a heat resistance of the heat-dissipating substrate is substantially less than that of an aluminum nitride substrate by 70% and is substantially less than that of a circuit board (i.e., a FR4 board) by 90%. Moreover, the cost of the heat-dissipating substrate in the present disclosure is lower than that of an aluminum nitride substrate by 95%.

The TVS diodes and the light emitting units in the present disclosure are mounted onto the electrode layer by using the same SMT, so that the manufacturing process of the LED package structure can be more consistent.

The two TVS diodes can be used to respectively protect the two light emitting units, and the position of the two TVS diodes can effectively prevent the two TVS diodes from shielding light emitted from the two light emitting units. Moreover, the distance between the optical centers of the two light emitting units is preferably within a range of 1.5-2.0 mm (or the distance between the centers of the two Fresnel lenses is within a range of 1.5-2.0 mm), thereby providing a better lighting efficiency.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A method for manufacturing a heat-dissipating substrate, comprising:
   providing a metal plate having a top surface and a bottom surface;
   implementing an etching process on the metal plate so as to form a first heat-dissipating block, a second heat-dissipating block, and a heat-dissipating plate spaced apart from each other; and
   filling an insulating material between the heat-dissipating plate and the first heat-dissipating block and between the heat-dissipating plate and the second heat-dissipating block so as to electrically isolate the heat-dissipating plate, the first heat-dissipating block, and the second heat-dissipating block from each other.

2. The method as claimed in claim 1, further comprising:
   implementing a micro-etching process on the top surface and the bottom surface of the metal plate so as to form a plurality of protrusions, wherein an etching depth of the micro-etching process is at a micro level and is smaller than a thickness of the metal plate.

3. The method as claimed in claim 2, wherein after the micro-etching process is implemented, the method further comprises:
   providing two adhesive plates each having a copper foil layer and a resin layer adhered to the copper foil layer, wherein the resin layers of the two adhesive plates respectively face the top surface and the bottom surface of the metal plate; and
   respectively hot-pressing the two adhesive plates onto the top surface and the bottom surface of the metal plate, so that the two resin layers are deformed to respectively surround side walls of the protrusions.

4. The method as claimed in claim 3, further comprising:
   removing the copper foil layers of the two adhesive plates so as to expose the protrusions and the resin layers after the insulating material is filled.

5. The method as claimed in claim 1, wherein in the etching process, the heat-dissipating plate is etched to form a first slot and a second slot both respectively arranged on two opposite sides thereof, the first heat-dissipating block is arranged in the first slot, the first heat-dissipating block and the first slot defines a first gap there-between, the second heat-dissipating block is arranged in the second slot, and the second heat-dissipating block and the second slot defines a second gap there-between; and the insulating material is filled in the first gap and the second gap to respectively form a first insulator and a second insulator.

6. The method as claimed in claim 5, wherein the shape of the first gap is an U-shape and the second gap is an U-shape, and each of the first insulator and the second insulator is an U-shape.

7. The method as claimed in claim 5, wherein in the etching process, the first heat-dissipating block is etched to form two first notches, the two first notches and two ends of the first gap are arranged on a first boundary of the metal plate, the heat-dissipating plate is etched to form two second notches, and the two second notches and two ends of the second gap are arranged on a second boundary of the metal plate; and two projected regions defined by orthogonally projecting the two first notches onto the second boundary respectively overlap with the two ends of the second gap, and two projected regions defined by orthogonally projecting the two second notches onto the first boundary respectively overlap with the two ends of the first gap.

8. A heat-dissipating substrate manufactured by implementing the method as claimed in claim 1.

9. A method for manufacturing a light emitting diode (LED) package structure, comprising:
   preparing the heat-dissipating substrate as claimed in claim 8;
   disposing an electrode layer and a soldering layer respectively on a top plane and a bottom plane of the heat-dissipating substrate, wherein each of the electrode layer and the soldering layer is connected to the first heat-dissipating block, the second heat-dissipating block, and the heat-dissipating plate; and
   mounting two light emitting units onto the electrode layer.

10. The method as claimed in claim 9, wherein the heat-dissipating substrate further includes a longitudinal insulating member covering two opposite surfaces of the first heat-dissipating block, two opposite surfaces of the second heat-dissipating block, and two opposite surfaces of the heat-dissipating plate.

11. The method as claimed in claim 9, wherein before the two light emitting units are mounted onto the electrode layer, the method further comprises:
   forming a reflective solder mask layer onto the top plane of the heat-dissipating substrate, wherein the electrode layer is embedded in the reflective solder mask layer, and wherein the reflective solder mask layer has two first openings, a part of the electrode layer is exposed from the reflective solder mask layer via the two first openings, and the two light emitting units are respectively arranged in the two first openings.

12. The method as claimed in claim 11, wherein the electrode layer has two positioning symbols respectively exposed from the reflective solder mask layer via the two first openings.

13. The method as claimed in claim 11, wherein the reflective solder mask layer has two second openings, and the method further comprises:

respectively arranging two diodes in the two second openings of the reflective solder mask layer, wherein each of the two diodes is fixed on a corresponding portion of the electrode layer exposed from the reflective solder mask layer via the two second openings.

14. The method as claimed in claim 9, further comprising:

disposing a reflective housing above the heat-dissipating substrate, wherein the two light emitting units are arranged in a space surrounded by the reflective housing.

15. The method as claimed in claim 9, wherein each of the two light emitting units has an optical center, and a distance between the optical centers of the two light emitting units is within a range of 1.5-2.0 mm.

16. The method as claimed in claim 10, further comprising:

adhering an optical member onto the heat-dissipating substrate, wherein the optical member has two Fresnel lenses, and centers of the two Fresnel lenses respectively correspond in position to the optical centers of the two light emitting units.

17. A light emitting diode (LED) package structure, comprising:

the heat-dissipating substrate as claimed in claim 8;

a longitudinal insulating member, wherein the longitudinal insulating member covers two opposite surfaces of the first heat-dissipating block, two opposite surfaces of the second heat-dissipating block, two opposite surfaces of the heat-dissipating plate, and side walls of each of the protrusions, and wherein the longitudinal insulating member and the protrusions jointly define at least part of a top plane and at least part of a bottom plane of the heat-dissipating substrate;

an electrode layer and a soldering layer respectively disposed on the top plane and the bottom plane of the heat-dissipating substrate, wherein the electrode layer and the soldering layer are respectively connected to the protrusions, thereby establishing an electrical connection there-between through the first heat-dissipating block, the second heat-dissipating block, and the heat-dissipating plate; and two light emitting units disposed on the electrode layer.

18. The LED package structure as claimed in claim 17, further comprising a reflective solder mask layer disposed on the top plane of the heat-dissipating substrate and being embedded with the electrode layer, wherein the reflective solder mask layer has two first openings, a part of the electrode layer is exposed from the reflective solder mask layer via the two first openings, and the two light emitting units are respectively arranged in the two first openings.

19. The LED package structure as claimed in claim 17, further comprising a reflective housing disposed above the heat-dissipating substrate and an optical member adhered to the reflective housing, wherein the two light emitting units are arranged in a space surrounded by the optical member and the reflective housing.

20. The LED package structure as claimed in claim 19, wherein each of the two light emitting units has an optical center, a distance between the optical centers of the two light emitting units is within a range of 1.5-2.0 mm, the optical member has two Fresnel lenses, and centers of the two Fresnel lenses respectively correspond in position to the optical centers of the two light emitting units.

* * * * *